United States Patent
Azimi et al.

(10) Patent No.: US 7,444,571 B1
(45) Date of Patent: *Oct. 28, 2008

(54) APPARATUS AND METHOD FOR TESTING AND DEBUGGING AN INTEGRATED CIRCUIT

(75) Inventors: Saeed Azimi, Union City, CA (US); Son Ho, Los Altos, CA (US); Daniel Smathers, Boulder, CO (US)

(73) Assignee: Marvell International Ltd., Hamilton (BM)

( * ) Notice: Subject to any disclaimer, the term of this patent is extended or adjusted under 35 U.S.C. 154(b) by 80 days.

This patent is subject to a terminal disclaimer.

(21) Appl. No.: 11/065,584

(22) Filed: Feb. 24, 2005

Related U.S. Application Data

(63) Continuation-in-part of application No. 10/375,986, filed on Feb. 27, 2003, now Pat. No. 7,216,276.

(51) Int. Cl.
*G01R 31/28* (2006.01)

(52) U.S. Cl. .................. 714/733; 714/724; 714/734; 714/30; 714/45; 703/28

(58) Field of Classification Search .............. None
See application file for complete search history.

(56) References Cited

U.S. PATENT DOCUMENTS

| | | | | |
|---|---|---|---|---|
| 4,674,089 | A | 6/1987 | Poret et al. ............. | 714/28 |
| 4,897,837 | A | 1/1990 | Ishihara et al. | |
| 5,649,129 | A | 7/1997 | Kowert | |
| 5,689,515 | A | 11/1997 | Panis | |
| 5,764,952 | A | 6/1998 | Hill | |
| 5,771,240 | A * | 6/1998 | Tobin et al. ............. | 714/724 |
| 5,781,560 | A | 7/1998 | Kawano et al. | |
| 5,812,562 | A | 9/1998 | Baeg | |
| 5,978,870 | A | 11/1999 | Warren | |
| 5,978,937 | A | 11/1999 | Miyamori et al. | |
| 6,028,983 | A * | 2/2000 | Jaber ..................... | 714/30 |
| 6,115,763 | A | 9/2000 | Douskey et al. | |
| 6,125,416 | A | 9/2000 | Warren | |
| 6,148,381 | A | 11/2000 | Jotwani | |
| 6,167,365 | A | 12/2000 | Karthikeyan et al. ...... | 703/28 |
| 6,189,115 | B1 | 2/2001 | Whetsel | |
| 6,279,051 | B1 | 8/2001 | Gates et al. | |
| 6,282,674 | B1 | 8/2001 | Patel et al. | |
| 6,289,300 | B1 | 9/2001 | Brannick et al. | |
| 6,314,530 | B1 | 11/2001 | Mann | |

(Continued)

OTHER PUBLICATIONS

IEEE Standard 1149.1, IEEE Standard Test Access Port and Boundary-Scan Architecture, 2001, 208 pages.

*Primary Examiner*—John P Trimmings

(57) ABSTRACT

A system for testing a target integrated circuit comprises a host device that executes a debugging and testing analysis program, that transmits test instructions and data to the integrated circuit and that analyzes received data from the target integrated circuit. A first interface module communicates with the host device and formats the test instructions and data using a first format. A first serializer serializes the test instructions and data. A first deserializer on the target integrated circuit communicates with the first serializer and deserializes the test instructions and data. A control module on the target integrated circuit communicates with the first deserializer, interprets the test instructions and data using the first format. A testing module receives the interpreted test instructions and data from the control module and performs testing and debugging of the target integrated circuit.

44 Claims, 7 Drawing Sheets

U.S. PATENT DOCUMENTS

| | | | |
|---|---|---|---|
| 6,321,354 B1 * | 11/2001 | Prunier | 714/726 |
| 6,356,960 B1 | 3/2002 | Jones et al. | |
| 6,389,558 B1 | 5/2002 | Herrmann et al. | |
| 6,401,191 B1 | 6/2002 | Jones | |
| 6,421,795 B2 | 7/2002 | Yamashita | |
| 6,457,124 B1 | 7/2002 | Yamashita | |
| 6,459,393 B1 * | 10/2002 | Nordman | 341/100 |
| 6,523,136 B1 | 2/2003 | Higashida | |
| 6,526,501 B2 | 2/2003 | Edwards et al. | |
| 6,642,736 B2 | 11/2003 | Mori et al. | |
| 6,665,737 B2 | 12/2003 | Edwards | |
| 6,687,857 B1 * | 2/2004 | Iwata et al. | 714/38 |
| 6,813,732 B2 | 11/2004 | Kurooka et al. | 714/45 |
| 6,820,051 B1 | 11/2004 | Swoboda | |
| 6,865,222 B1 * | 3/2005 | Payne | 375/224 |
| 6,868,376 B2 | 3/2005 | Swoboda | |
| 6,918,058 B2 | 7/2005 | Miura et al. | |
| 6,957,180 B1 * | 10/2005 | Nemecek | 703/28 |
| 6,973,592 B2 | 12/2005 | Debling | |
| 7,003,599 B2 | 2/2006 | Warren et al. | |
| 7,007,201 B1 | 2/2006 | Byrne et al. | |
| 7,010,612 B1 * | 3/2006 | Si et al. | 709/232 |
| 7,031,903 B2 | 4/2006 | Debling | |
| 7,076,708 B2 | 7/2006 | Faust et al. | |
| 7,080,789 B2 | 7/2006 | Leaming | |
| 7,096,310 B2 | 8/2006 | Norden | |
| 7,127,649 B2 | 10/2006 | Leaming | |
| 7,197,680 B2 | 3/2007 | Kimelman et al. | |
| 7,278,073 B2 | 10/2007 | Kimelman et al. | |
| 7,350,121 B2 | 3/2008 | Creigh | |
| 7,363,564 B2 | 4/2008 | Moss et al. | |
| 2001/0016929 A1 | 8/2001 | Bonneau et al. | |
| 2002/0002691 A1 * | 1/2002 | Whetsel | 714/28 |
| 2002/0026553 A1 | 2/2002 | Saito | |
| 2002/0108080 A1 | 8/2002 | Mori et al. | |
| 2002/0184001 A1 | 12/2002 | Yao | 703/28 |
| 2004/0078690 A1 | 4/2004 | Kohashi | |
| 2004/0100946 A1 | 5/2004 | Schriel et al. | |
| 2004/0210797 A1 | 10/2004 | Kimelman et al. | |
| 2004/0221201 A1 | 11/2004 | Seroff | |
| 2004/0250191 A1 | 12/2004 | Leaming | 714/742 |
| 2006/0242501 A1 | 10/2006 | Kimelman et al. | |

* cited by examiner

APPARATUS AND METHOD FOR TESTING AND DEBUGGING AN INTEGRATED CIRCUIT

CROSS-REFERENCE TO RELATED APPLICATIONS

This application is a continuation-in-part of U.S. patent application Ser. No. 10/375,986, now U.S. Pat. No. 7,216,276, filed Feb. 27, 2003. The disclosure of the above application is incorporated herein by reference.

TECHNICAL FIELD

This invention relates generally to testing systems and devices and specifically to a system and method for downloading trace information from an integrated circuit.

BACKGROUND OF THE INVENTION

One disadvantage of shrinking microelectronics is that the testing of integrated circuits becomes exponentially more complex. A convenient and efficient means of testing increasingly complex integrated circuits is to design them with testing hardware already built-in. In 1985, a consortium of European electronics companies formed the Joint Test Action Group (JTAG) in order to create an industry standard which would define an architecture and software protocol for built-in testing hardware. The resulting standard, sometimes referred to as JTAG, was adopted by the Institute of Electrical and Electronics Engineers (IEEE) as IEEE Standard 1149.1.

The JTAG standard uses a boundary scan architecture, so called because the JTAG circuitry is connected to a dedicated path around the integrated circuit's boundary (where the I/O pins are located). JTAG uses this boundary path to directly input to, and download data and instructions from, the I/O pins of the integrated circuit. The JTAG capability of an integrated circuit is accessed through a multi-pin JTAG test access port (TAP), through which instructions and data from external testing software are input and instructions and data from the integrated circuit are output.

The JTAG interface and circuitry can be used to implement debugging and emulation functions. In debugging embodiments, the JTAG interface is used to download code, execute it, and examine register and memory values. In system-on-a-chip (SOC) embodiments which perform emulation, an in-circuit emulator (ICE) is often embedded in the SOC. The embedded ICE is an actual processor, or a specially modified version of the standard processor, combined with special purpose instrumentation logic to perform the debugging and emulation functions. With emulation, one can test the embedded processor software with techniques such as code trace, benchmarking, trapping, evaluating breakpoints, profiling, etc. However, such extra functions usually require extra pins (besides the JTAG TAP) to output the resulting data.

FIG. 1 shows a conventional SOC 100 with an embedded ICE 105 located within the embedded processor 110 of the SOC 100. An external debugging and emulation program, located in personal computer (PC) 120, uses the JTAG interface logic 125 (by means of JTAG TAP, not shown here) to access and control ICE 105. When running, ICE 105 takes over the embedded processor 110 which controls most of the functions of the SOC 100. As such, ICE 105 can access, control, upload, and download from any of the memory 130 or peripheral modules 135 which control other SOC components 137.

The output of the debugging and emulation is forwarded to trace logic 140 and, more particularly, to trace FIFO (First-In, First-Out) buffer 145, where the trace output is collected for download, through trace port and status analyzer 150, to the external debugging and emulation program on PC 120, where the trace output is analyzed.

One problem with the prior art design is that the trace port and status analyzer 150 uses multiple pins of the SOC for the parallel output of the trace data. The amount of data is thus limited by the number of pins which can be designated as trace output pins in the SOC design. As SOCs become more complex and faster, not only does the total number of I/O pins needed for critical functions increase—thus reducing the number of available pins which can be designated as trace output pins—but also the amount of trace data increases, thus requiring more trace output pins for transferring the increased trace data. Furthermore, bandwidth limitations may limit data rates between the trace port and status analyzer 150 and the on chip trace logic 140.

Usually, it is the number of trace output pins that are sacrificed for other uses in integrated circuit design, thereby causing difficulties as well as a bottleneck at the trace port output of the integrated circuit. One solution to this problem is to create a larger trace FIFO buffer 145 so that more data may be stored while the parallel output is downloading as much data as it can. However, area on an integrated circuit is in short supply, and using up more area for a trace FIFO buffer is expensive and wasteful.

Therefore, there is a need for an improved trace output interface for SOCs using in-circuit emulators (ICEs).

SUMMARY OF THE INVENTION

A system for testing a target integrated circuit comprises a host device that executes a debugging and testing analysis program, that transmits test instructions and data to the target integrated circuit and that analyzes received data from the target integrated circuit. A first interface module communicates with the host device and formats the test instructions and data using a first format. A first serializer serializes the test instructions and data. A first deserializer on the target integrated circuit communicates with the first serializer and deserializes the test instructions and data. A control module on the target integrated circuit communicates with the first deserializer, interprets the test instructions and data using the first format. A testing module receives the interpreted test instructions and data from the control module and performs testing and debugging of the target integrated circuit.

In other features, the first format is substantially compliant with a Joint Task Action Group (JTAG) format and/or a universal asynchronous receiver transmitter (UART) format. A second interface module communicates with the host device and formats the test instructions and data using a second format. The control module interprets the test instructions and data using the second format. The testing module includes an embedded in-circuit emulator (ICE) that emulates functionality of at least one processor on the target integrated circuit.

In other features, a frame capture module on the target integrated circuit receives test results. A first control module communicates with the frame capture module and generates first format control data for the first interface module. The frame capture module packages at least one of the test results and the first format control data into frames. A second serializer serializes the frames from the frame capture module.

In other features, the second serializer operates a rate that is higher than a rate of the first serializer. A frame capture module on the target integrated circuit receives test results. A format control module communicates with the frame capture module and selectively generates one of first and second format control data for a respective one of the first and second interface logic modules. The frame capture module packages at least one of the test results and the one of the first and second format control data into frames. A second serializer serializes the frames from the frame capture module.

In other features, the second serializer operates a rate that is higher than a rate of the first serializer. A second deserializer communicates with the second serializer and deserializes the frames. A frame sync module receives the deserialized frames and synchronizes the frames. An analyzer receives the frames from the frame sync module.

In other features, the frame sync module forwards control frames to the first interface module. A diagnostic module receives at least one of digital control, state and/or error data from the frame sync module. The diagnostic module includes a digital to analog converter (DAC) that converts the at least one of the digital control, state and/or error data to at least one of analog control, state and/or error data. An oscilloscope communicates with the DAC and displays the at least one of the analog control, state and/or error data. A logic analyzer communicates with the diagnostic module. An indicator communicates with the diagnostic module and displays state data.

A method for testing a target integrated circuit comprises executing a debugging and testing analysis program; transmitting test instructions and data to the target integrated circuit and analyzing received data from the target integrated circuit; formatting the test instructions and data using a first format; serializing the test instructions and data; deserializing the test instructions and data; interpreting the test instructions and data using the first format; and performing testing and debugging of the target integrated circuit.

In other features, the first format is substantially compliant with a Joint Task Action Group (JTAG) format and/or a universal asynchronous receiver transmitter (UART) format. The method includes formatting the test instructions and data using a second format; and interpreting the test instructions and data using the second format.

In still other features, the method includes emulating functionality of at least one processor on the target integrated circuit. The method also includes receiving test results; generating first format control data; packaging at least one of the test results and the first format control data into frames; and serializing the frames.

In yet other feature, the method includes receiving test results; selectively generating one of first and second format control data; packaging at least one of the test results and the one of the first and second format control data into frames; and serializing the frames.

In other features, the method includes deserializing the frames; and receiving the deserialized frames and synchronizing the frames. The method includes analyzing the frames and forwarding control frames. The method includes receiving at least one of digital control, state and/or error data; and converting the at least one of the digital control, state and/or error data to at least one of analog control, state and/or error data.

A system for testing a target integrated circuit comprises host means for executing a debugging and testing analysis program, for transmitting test instructions and data to the target integrated circuit and for analyzing received data from the target integrated circuit. First interface means communicates with the host means and formats the test instructions and data using a first format. First serializer means serializes the test instructions and data. First deserializer means on the target integrated circuit communicates with the first serializer means and deserializes the test instructions and data. Control means on the target integrated circuit communicates with the first deserializer means and interprets the test instructions and data using the first format. Testing means receives the interpreted test instructions and data from the control means and performs testing and debugging of the target integrated circuit.

In other features the first format is substantially compliant with a Joint Task Action Group (JTAG) format and/or a universal asynchronous receiver transmitter (UART) format. Second interface means communicates with the host means and formats the test instructions and data using a second format. The control means interprets the test instructions and data using the second format.

In other features, the testing means includes an embedded emulating means for emulating functionality of at least one processor on the target integrated circuit. Frame capture means on the target integrated circuit receives test results. First control means communicates with the frame capture means and generates first format control data for the first interface means. The frame capture means packages at least one of the test results and the first format control data into frames. Second serializing means serializes the frames from the frame capture means.

In other features, the second serializing means operates at a rate that is higher than a rate of the first serializer means. Frame capture means on the target integrated circuit receives test results. Format control means communicates with the frame capture means and selectively generates one of first and second format control data for a respective one of the first and second interface logic means. The frame capture means packages at least one of the test results and the one of the first and second format control data into frames. Second serializer means serializes the frames from the frame capture means. The second serializer means operates at a rate that is higher than a rate of the first serializer means. Second deserializer means communicates with the second serializer means and deserializes the frames. Frame sync means receives the deserialized frames and synchronizes the frames. Analyzing means receives the frames from the frame sync means. The frame sync means forwards control frames to the first interface means.

In other features, diagnostic means receives at least one of digital control, state and/or error data from the frame sync means. The diagnostic means includes analog converting means for converting the at least one of the digital control, state and/or error data to at least one of analog control, state and/or error data. Display means communicates with the DAC and displays the at least one of the analog control, state and/or error data. Logic analyzing means communicates with the diagnostic means. Indicating means communicates with the diagnostic means and displays state data.

An integrated circuit comprises a first deserializer that deserializes serial data containing at least one of test instructions and/or data in a first format. A control module communicates with the first deserializer, interprets the test instructions and data using the first format, receives the interpreted test instructions and data from the control module and performs testing and debugging of the integrated circuit. A frame capture module receives test results from the testing module. A first control module that communicates with the frame capture module and generates first format control data. The frame capture module packages the test results and the first format control data into frames. A first serializer serializes the frames.

A system comprises the integrated circuit and further comprises a host device that executes a debugging and testing analysis program and that transmits the test instructions and data to the integrated circuit. A first interface module communicates with the host device and formats the test instructions and data using the first format. A second serializer serializes the formatted test instructions and data and outputs the test instructions and data to the first deserializer.

In other features, the first serializer operates at a higher speed than the second serializer. The second deserializer operates at speeds less than 200 Mb/s and the first serializer operates at speeds greater than 3 Gb/s. The first format is substantially compliant with a Joint Task Action Group (JTAG) format. The first format is a universal asynchronous receiver transmitter (UART) format. A second interface module communicates with the host device and formats the test instructions and data using a second format. The control module interprets the test instructions and data using the second format.

In other features the control module includes an embedded in-circuit emulator (ICE) that emulates functionality of at least one processor on the integrated circuit. The system further comprises a second deserializer that communicates with the second serializer and that deserializes the frames. A frame sync module receives the deserialized frames and synchronizes the frames.

In other features, the system further comprises an analyzer that receives the frames and that forwards the frames to the host device. The frame sync module forwards control frames to the first interface module. A diagnostic module receives at least one of digital control, state and/or error data from the second deserializer. The diagnostic module includes a digital to analog converter (DAC) that converts the at least one of digital control, state and/or error data to at least one of analog control, state and/or error data. An oscilloscope communicates with the DAC and displays the at least one of analog control, state and/or error data. A logic analyzer communicates with the diagnostic module. An indicator communicates with the diagnostic module and displays state data.

A method comprises deserializing serial data containing at least one of test instructions and/or data in a first format; interpreting the test instructions and data using the first format; receiving the interpreted test instructions and data and performing testing and debugging of the integrated circuit; receiving test results; generating first format control data; packaging the test results and the first format control data into frames; and serializing the frames.

In other features the method includes executing a debugging and testing analysis program and transmitting the test instructions and data to the integrated circuit; formatting the test instructions and data using the first format; and serializing the formatted test instructions and data and outputting the test instructions and data. The first format is substantially compliant with a Joint Task Action Group (JTAG) format. The first format is a universal asynchronous receiver transmitter (UART) format. The method includes formatting the test instructions and data using a second format; and interpreting the test instructions and data using the second format.

In other features, the method further comprises emulating functionality of at least one processor on the integrated circuit. The method includes deserializing the frames and synchronizing the frames and analyzing the frames and forwarding the frames to a host. The method includes receiving at least one of digital control, state and/or error data; converting the at least one of digital control, state and/or error data to at least one of analog control, state and/or error data; displaying the at least one of analog control, state and/or error data; and displaying state data.

An integrated circuit comprises first deserializer means for deserializing serial data containing at least one of test instructions and/or data in a first format. Control means communicates with the first deserializer means, interprets the test instructions and data using the first format, receives the interpreted test instructions and data from the control means and performs testing and debugging of the integrated circuit. Frame capture means receives test results from the testing means. First control means communicates with the frame capture means and generates first format control data. The frame capture means packages the test results and the first format control data into frames. First serializer means serializes the frames.

In other features, a system comprises the integrated circuit and further comprises host means for executing a debugging and testing analysis program and for transmitting the test instructions and data to the integrated circuit. First interface means communicates with the host means and formats the test instructions and data using the first format. Second serializer means serializes the formatted test instructions and data and outputs the test instructions and data to the first deserializer means.

In other features, the first serializer means operates at a higher speed than the second serializer means. The second deserializer means operates at speeds less than 200 Mb/s and the first serializer means operates at speeds greater than 3 Gb/s. The first format is substantially compliant with a Joint Task Action Group (JTAG) format. The first format is a universal asynchronous receiver transmitter (UART) format. Second interface means communicates with the host means and formats the test instructions and data using a second format. The control means interprets the test instructions and data using the second format. The testing means includes emulator means for emulating functionality of at least one processor on the integrated circuit.

In other features, second deserializer means communicates with the second serializer means and deserializes the frames. Frame sync means receives the deserialized frames and synchronizes the frames. Analyzing receives the frames and forwards the frames to the host means. The frame sync means forwards control frames to the first interface means. Diagnostic means receives at least one of digital control, state and/or error data from the second deserializer means. The diagnostic means includes analog converting means for converting the at least one of digital control, state and/or error data to at least one of analog control, state and/or error data. Display means communicates with the converting means and displays the at least one of analog control, state and/or error data. Analyzing means communicates with the diagnostic means. Indicating means communicates with the diagnostic means and displays state data.

An interface that communicates with first and second interface modules, an analyzer and an integrated circuit comprises a first path from the first and second interface modules and the analyzer to the integrated circuit. The first path includes a first serializer that serializes at least one of first control data and/or test data from at least one of the first and/or second interface modules. A second path from the integrated circuit to the first and second interface modules and the analyzer includes a high speed deserializer that deserializes serial data containing at least one of test result data and/or second control data from the integrated circuit. A frame sync module synchronizes data from the high speed deserializer to identify frames. The high speed deserializer outputs the second control data to at least one of the first and/or second interface modules. The frame sync module outputs the frames to the analyzer.

A method for providing an interface that communicates with first and second interface modules, an analyzer and an integrated circuit comprises providing a first path from the interface logic module and the analyzer to the integrated circuit; serializing at least one of first control data and/or test data from at least one of the first and/or second interface module; providing second path from the integrated circuit to the first and second interface logic module and the analyzer; deserializing serial data containing at least one of test result data and/or second control data from the integrated circuit; and synchronizing data to identify frames.

In other features, the method includes outputting the second control data to at least one of the first and/or second interface module. The method includes outputting the frames to the analyzer.

An interface for communicating with first and second interface modules, an analyzer and an integrated circuit comprises a first path from the first and second interface module and the analyzer to the integrated circuit. The first path includes first serializer means for serializing at least one of first control data and/or test data from at least one of the first and/or second interface means. A second path from the integrated circuit to the first and second interface module and the analyzer includes a high speed deserializer means for deserializing serial data containing at least one of test result data and/or second control data from the integrated circuit. Frame sync means synchronizes data from the high speed deserializer means to identify frames.

In other features, the high speed deserializer means outputs the second control data to at least one of the first and/or second interface module. The frame sync means outputs the frames to the analyzer.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION

Figure 1:
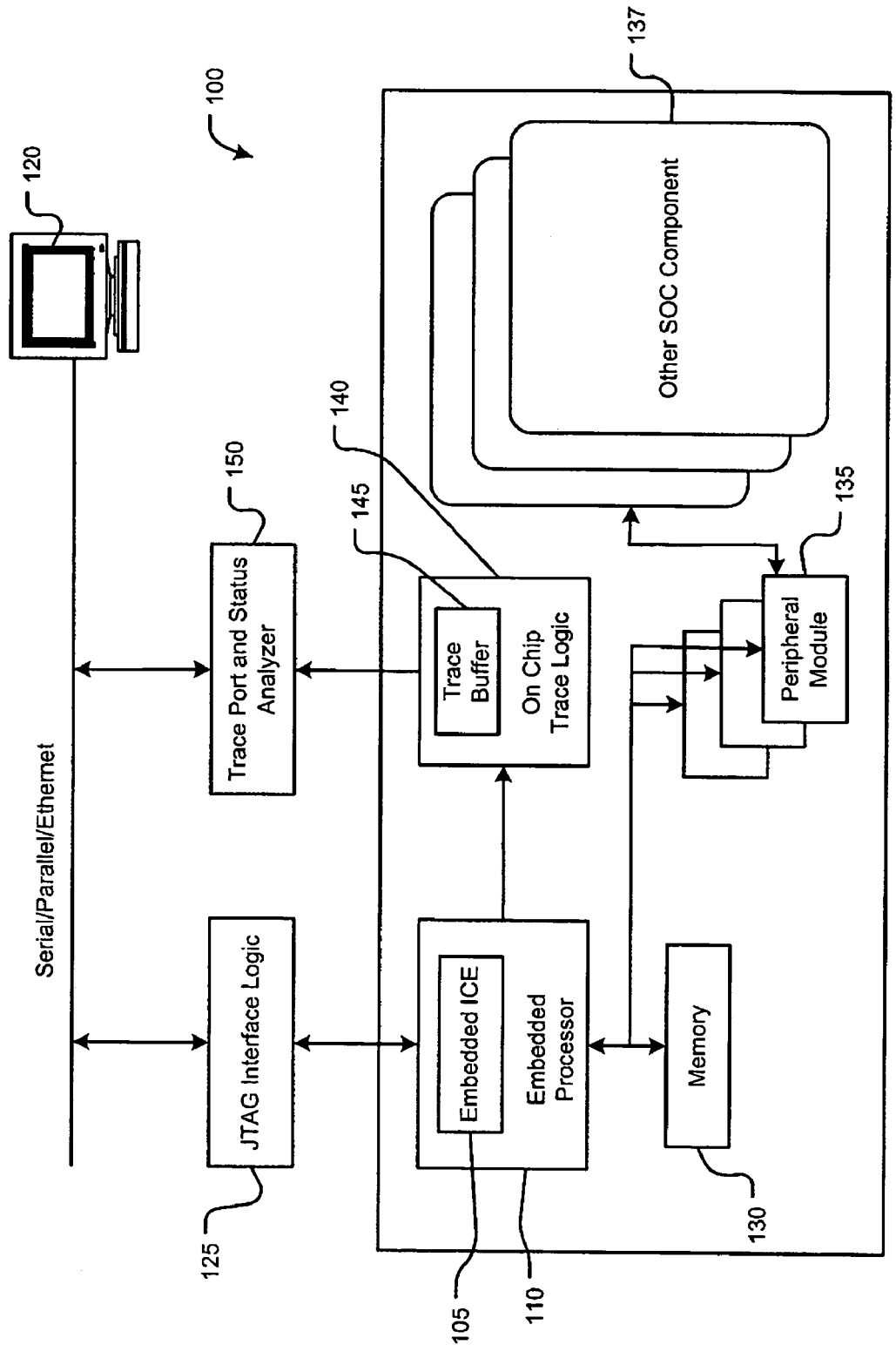
FIG. 1 is a block diagram of a prior art debugging and emulation system for a system-on-a-chip (SOC)

The following description of the preferred embodiment(s) is merely exemplary in nature and is in no way intended to limit the invention, its application, or uses. For purposes of clarity, the same reference numbers will be used in the drawings to identify similar elements. As used herein, the term module refers to an application specific integrated circuit (ASIC), an electronic circuit, a processor (shared, dedicated, or group) and memory that execute one or more software or firmware programs, a combinational logic circuit, and/or other suitable components that provide the described functionality.

Figure 2:
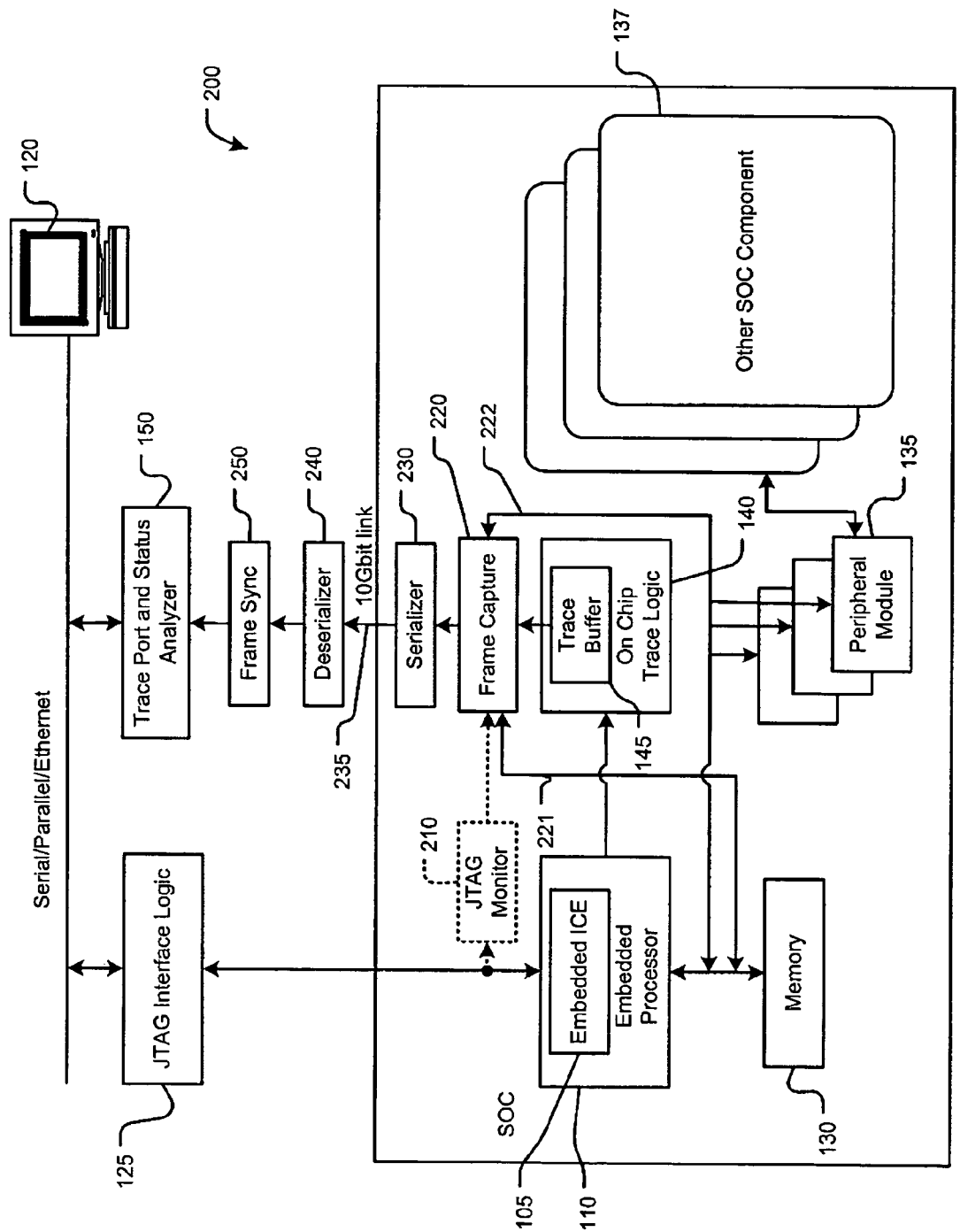
FIG. 2 is a block diagram of a debugging and emulation system for an SOC according to a preferred embodiment of the present invention.

FIG. 2 shows an SOC 200 with a debugging and emulation system according to a preferred embodiment of the present invention. Similarly to FIG. 1, embedded ICE 105 is located within embedded processor 110. An external debugging and emulation program, located in PC 120, uses the JTAG interface logic 125 (by means of JTAG TAP, not shown here) to access and control ICE 105. ICE 105 can access, control, upload, and download from any memory 130 or peripheral modules 135 which control other SOC components 137. The output of the debugging and emulation is forwarded to trace logic 140 and, more particularly, to trace FIFO (First-In, First-Out) 145.

Although the preferred embodiment in FIG. 2 uses a JTAG interface 125, it should be understood that the present invention is not limited to such an interface. In fact, any debugging and testing hardware, with or without an emulator, may be used with the present invention. Furthermore, the memory 130 may be any sort of memory, whether volatile or non-volatile, in an integrated circuit, and the trace buffer 145 may have any sort of configuration (i.e., it is not limited to a FIFO configuration).

Unlike FIG. 1, the output of trace FIFO 145 does not go directly to a trace output 150 port. Instead, the trace FIFO 145 output is forwarded to Frame Capture Unit 220 where it, along with other data, is packaged into frames. In other embodiments, it is possible for Frame Capture Unit 220 to capture data from the memory subsystems of the SOC (indicated by line 221) or from peripheral modules 135 (indicated by line 222). The frames into which this data is packaged are the communication units used by the serial output. Once a frame is completed it is forwarded to Serializer 230, which converts the parallel format of the frames to serial format for output. Once serialized, the data is transferred out of SOC 200 on communication link 235. To connect with SOC 200, communication link 235 only requires the minimum number of pins. In the preferred embodiment, there are only two pins used for serial differential output versus the nine or more pins used in the prior art.

In the present invention, a SERDES interface capable of transmission rates in the gigabit range is used to serially transmit data from the trace FIFO to the analyzing software on PC 120. In some implementations, a 10 Gb SERDES using XAUI circuitry can be employed. Alternatively, one, two or more 4.25 Gb/s links (each generally requiring two (differential) pins) can be employed.

After the serialized data has crossed communication link 235, it arrives at Deserializer 240, where the data is reconfigured into its original parallel format. Thereafter, the data enters Frame Sync Unit 250 which synchronizes the parallel data so that the correct boundaries between an incoming frame and the next incoming frame can be located or otherwise established. While Ethernet frames can be used, custom frames may be used to increase efficiency.

Once the frame boundaries are restored, the original data can be unpackaged from the frames and sent to the debugging and emulation software on PC 120. Such a transmission could be carried out, for example, by an interface connecting Frame Sync Unit 250 with a local area network (LAN), such as an Ethernet LAN. In other embodiments, it would be possible to connect the Frame Sync Unit 250 directly with a wide area network (WAN), such as the Internet, so that troubleshooting may be performed remotely. The Trace Port and Status Analyzer 150 captures the data now in parallel format in a large SRAM buffer for later analysis by the software on PC 120.

An optional JTAG Monitor 210 receives configuration information from the external debugging and emulation program, located in PC 120, through JTAG interface logic 125 and ICE 105. This information is used to appropriately configure the Frame Capture Unit 220 to accept incoming data from trace FIFO buffer 145. In some implementations, the embedded processor 110 performs this function. This is needed because the timing and manner in which framing should be performed will be affected by the nature of the testing being performed, the nature of the testing output, the timing of the testing output, synchronization with the external system bus, etc. If used, the JTAG monitor 210 may be very simple (e.g., comprised of a few registers) or very complex, depending on the embodiment of the present invention, and particularly depending on the types and sources of data being input into Frame Capture Unit 220.

Figure 2A:
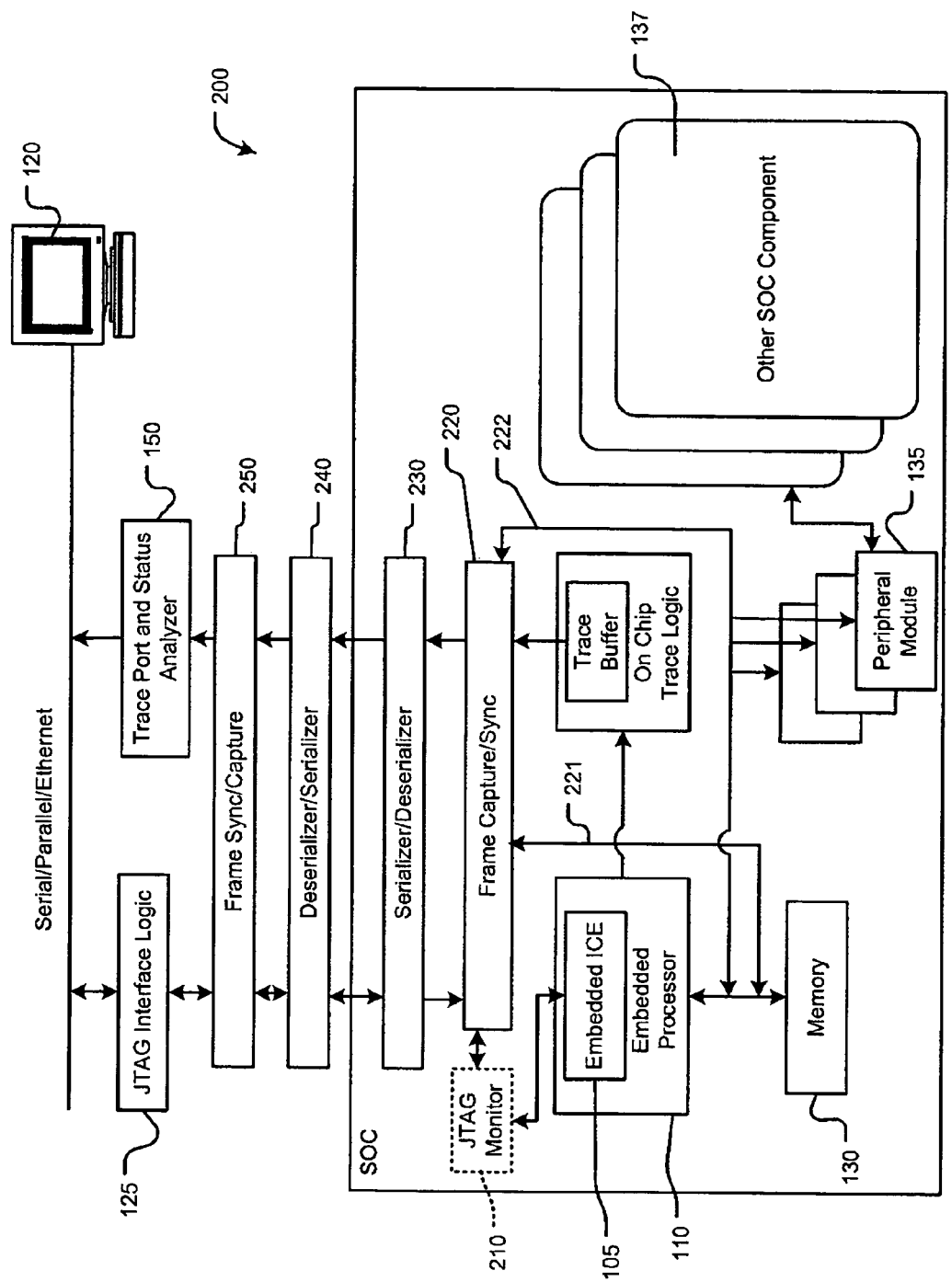
FIG. 2A is a block diagram of a debugging and emulation system for an SOC according to another preferred embodiment of the present invention.

FIG. 2A is a block diagram of a debugging and emulation system for an SOC according to another preferred embodiment of the present invention. The SERDES in FIG. 2A is bi-directional, in contrast to the unidirectional SERDES of FIG. 2. Thus, in addition to serving as the output for the testing and debugging data, the SERDES in FIG. 2A also serves as the input for the instructions and data which the testing and debugging program on PC 120 sends to embedded ICE 105 and embedded processor 110.

Some of the components of the SERDES in FIG. 2A have dual functions. For instance, Frame Sync Unit 230 in FIG. 2A acts as both a Frame Sync unit for the testing and debugging of data returning to the analysis software on PC 120, and as a Frame Capture Unit for the instructions and data which the analysis software on PC 120 is sending to the embedded ICE 105 and embedded processor 110. Both Serializer 230 and Deserializer 240 in FIG. 2A are combination Serializer/Deserializers for the bi-directional data traffic. Also, the Frame Sync Unit 250 and Frame Capture Unit 220 serve dual functions, namely frame synchronizing and frame capturing. The bi-directional SERDES of FIG. 2A may or may not need JTAG Monitor 210. It is contemplated that configuration data for Frame Capture Unit 220 may come directly from the analysis software on PC 120 through the bi-directional SERDES itself, thereby obviating any need for a separate JTAG Monitor 210. Furthermore, the present invention is not limited to using a JTAG interface, so that any hardware/firmware/software protocol for testing and debugging an integrated circuit may be used with the present invention.

Figure 3:
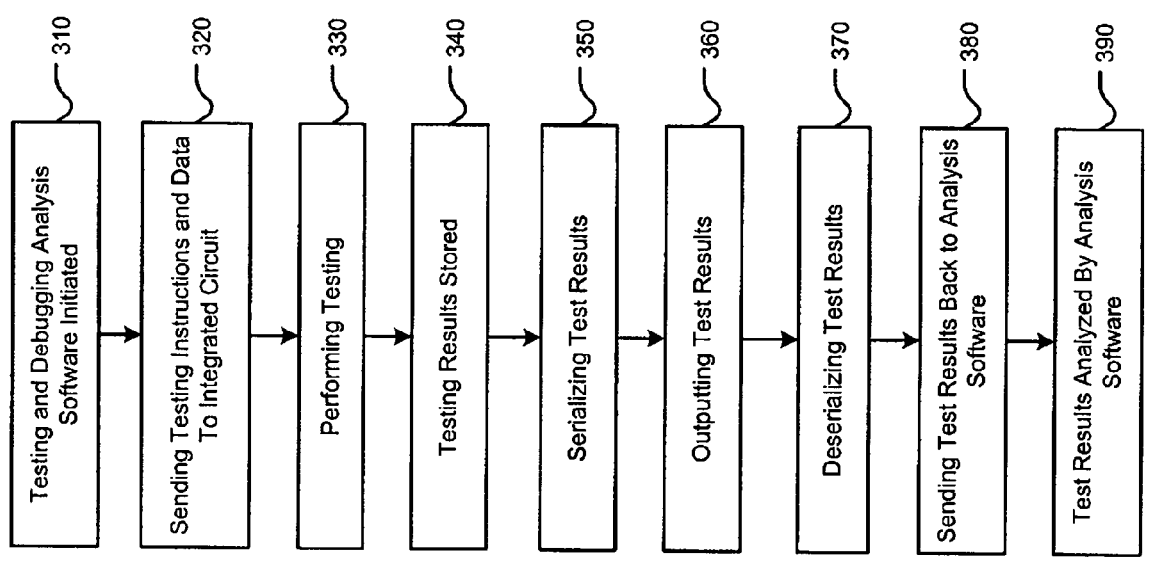
FIG. 3 is a flowchart showing a method for outputting debugging and emulation data from an SOC according to a preferred embodiment of the present invention.

A flow chart generally illustrating a method for testing and debugging an integrated circuit according to a preferred embodiment of the present invention is shown in FIG. 3. In step 310, the testing and debugging analysis software on PC 120 is initiated. In step 320, instructions for testing the integrated circuit and testing data are sent from the analysis software to the integrated circuit. In step 330, testing is performed on the integrated circuit in accordance with the testing instructions and data sent from the analysis software. The results of this testing and other data is stored in step 340. The stored data is serialized in step 350, and output off the integrated circuit in step 360. In step 370, the output data is deserialized and sent back to the analysis software in step 380. Finally, the testing results and data are analyzed in step 390 by the testing and debugging analysis software on PC 120.

Although the steps in FIG. 3 are shown in a particular order, it should be understood that these steps may occur in a different order, or even simultaneously. For example, steps 320 through 380 may be occurring substantially simultaneously, i.e., a train of instructions may be input (step 320) at the same time as results from the first instructions are arriving back at the analysis software in PC 120 (step 380). Furthermore, the steps should be understood in their broadest context. For example, storing step 340 may comprise storing testing results and data in longer term large-scale memory, such as ROM, RAM or external DRAM (not shown), for later framing operations, or in short term small scale memory, such as a bank of registers, for immediate processing and output. Step 340 may also occur between steps 370 and 380 as will be described in conjunction with FIG. 4.

Figure 3A:
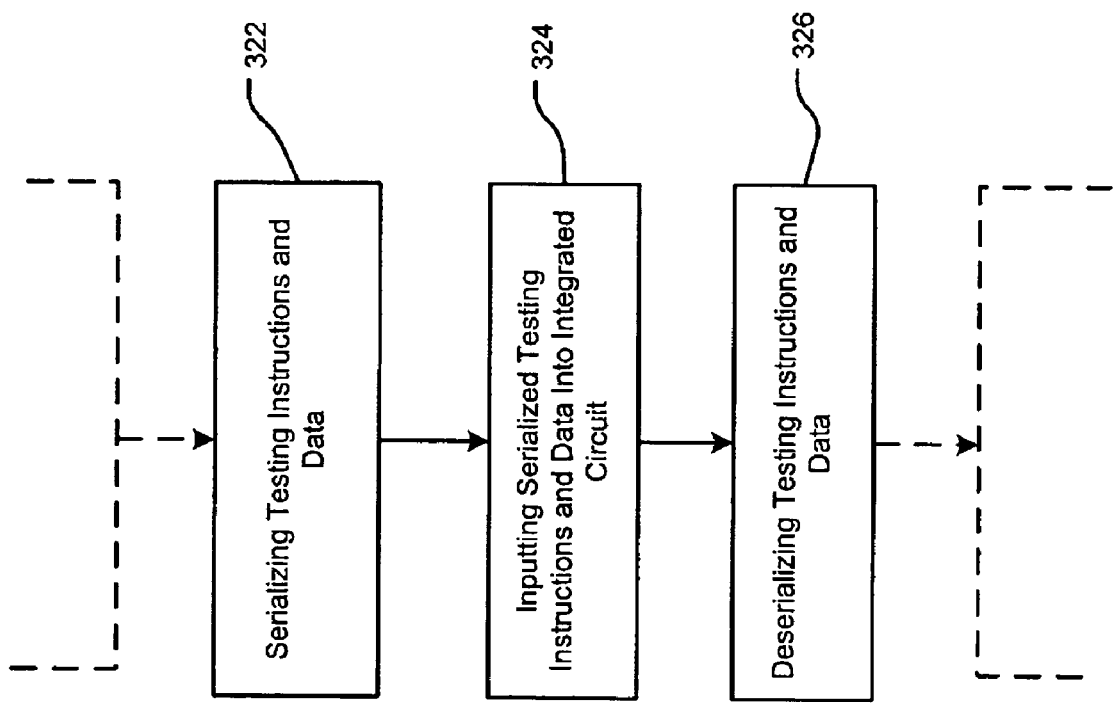
FIG. 3A is flowchart showing the sub-steps comprising step 320 in FIG. 3 according to another embodiment of the present invention.

FIG. 3A is a flowchart illustrating the sub-steps comprising the step of sending instructions for testing the integrated circuit and testing data from the analysis software to the integrated circuit (step 320 from FIG. 3) according to another embodiment of the present invention. These steps generally illustrate the operation of the embodiment shown in FIG. 2A. In such an embodiment, the inventive SERDES serves as both the input and the output for the testing and debugging operations. Returning to FIG. 3A, in step 322, the instructions and data from the analysis software on PC 120 are serialized before being input in step 324 into the integrated circuit. Once on-chip (i.e., in integrated circuit 200), the instructions and data are deserialized in step 326 so that they may be used by the on-chip testing and debugging hardware.

Some of the advantages of the present invention can be seen in the preferred embodiment described herein. Specifically, the number of pins required for the output of trace FIFO and other data is substantially reduced. Since there are a limited number of pins on an integrated circuit, the reduction of trace output pins increases the number of I/O pins available for other functions. This advantage will have increasing importance as integrated circuits become more complex and smaller. Yet another advantage is the elimination of the prior art high speed parallel interfaces which greatly increase chip power. Still another advantage is the reduced cost of packaging when implementing the present invention.

Figure 4:
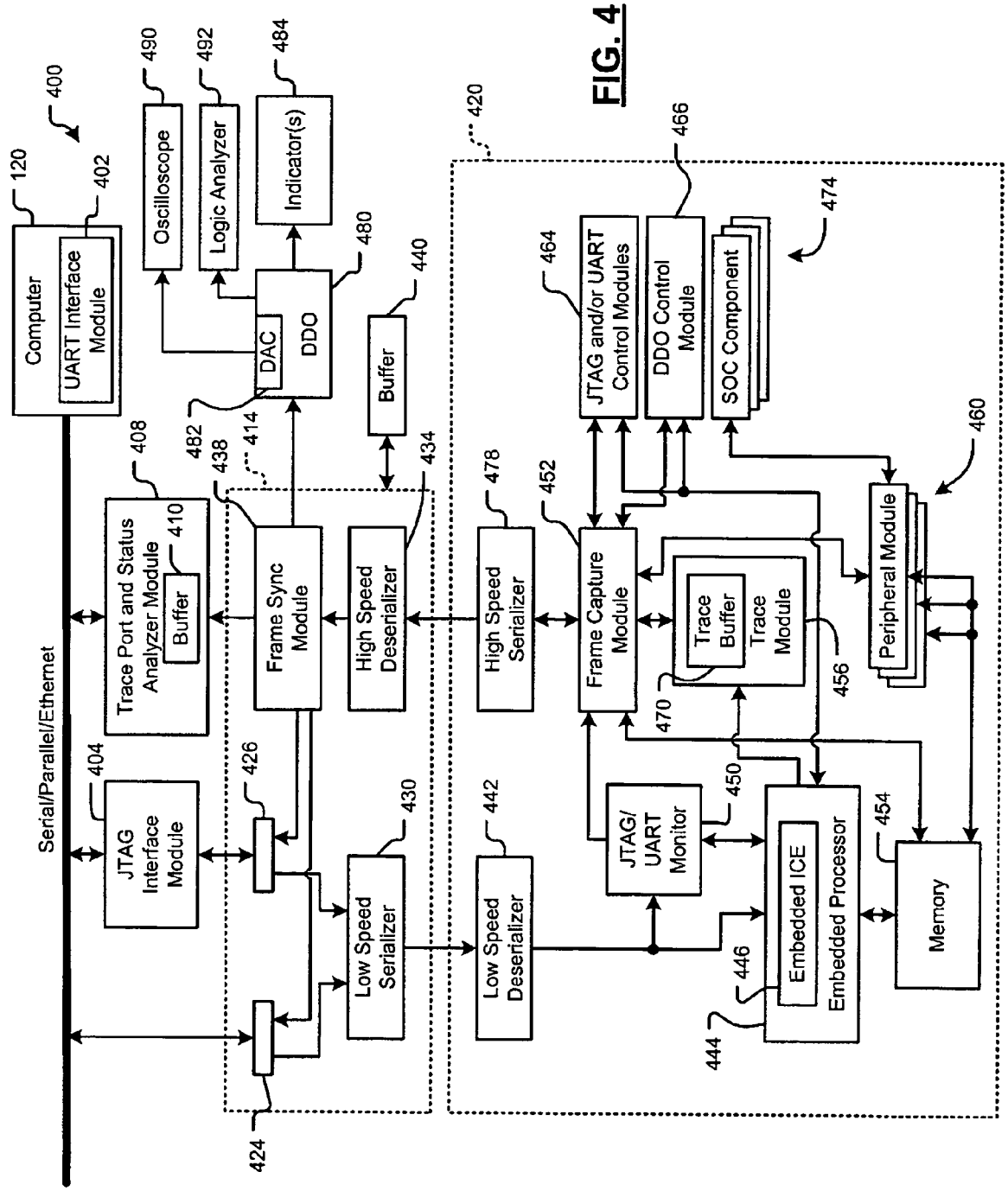
FIG. 4 is a functional block diagram of an alternate debugging and emulation system.

Referring now to FIG. 4, an alternate debugging and emulation system according to some implementations is shown generally at 400. The debugging and emulation system 400 includes a host device 120 such as a computer running an external debugging and emulation program. The host device 120 incorporates universal asynchronous receiver transmitter (UART) module 402 and/or interfaces with JTAG interface module 404 which send/receive control code such as test instructions and data such as test data, register values, and memory values to a system on chip 420 using UART and JTAG formats. The host device 120 also receives test results via host trace port and status analyzer 408, which may include a buffer 410. The buffer 410 may store data when the connection between the trace port and the PC is slower than the data being collected at the trace port. A serializing/deserializing module 414 according to some implementations of the present invention significantly reduces the number of pins that are required to interface the UART interface module 402, the JTAG interface module 404 and/or the trace port and status analyzer 408 to the SOC 420.

In some implementations, the serializing/deserializing module 414 is an integrated circuit. The serializing/deserializing module 414 includes interfaces 424 and 426 that communicate with the UART and JTAG interface modules 402 and 404, respectively. The UART interface module 402 sends UART control code and/or data via the interface 424 to a low speed serializer 430. The JTAG interface module 404 sends JTAG control code and/or data via the interface 426 to the low speed serializer 430. In some implementations, the interfaces 424 and 426 can be combined. In one implementation, the low speed serializer 430 operates at data rates less than 200 Mb/s. In other implementations, the low speed serializer 430 operates at data rates around 100 Mb/s.

A high speed deserializer 434 selectively transmits UART control code and/or data to the UART interface module 402 via the interface 424. The frame sync module 438 selectively sends JTAG control code and/or data to the JTAG interface module 404 via the interface 426. The frame sync module 438 selectively sends the test results and/or other output of debugging and emulation to the trace port and status analyzer 408. In some implementations, the frame sync module 438 also selectively sends control code (such as state data, error messages, etc.) to a data diagnostic output (DDO) module 480, as will be described below.

An input of the high speed deserializer 434 receives data from a high speed serializer 478 in the SOC 420. In some implementations, the high speed deserializer 434 is connected to the SOC 420 using two or four pins. In one implementation, the high speed serializer/deserializer operates at data rates greater than or equal to 800 Mb/s. In other implementations, the high speed serializer/deserializer operates at data rates greater than or equal to 1 Gb/s. In still other implementations, the high speed serializer/deserializer operates at speeds greater than or equal to 5 or 10 Gb/s. External memory 440 such as DRAM may be provided for buffering data if desired. In some implementations, the memory 440 contains at least 50 MB of storage.

The SOC 420 also includes a low speed deserializer 442 that deserializes data sent by the low speed serializer 430. The low speed deserializer 442 outputs deserialized data to an embedded processor 444 having an embedded ICE 446 and to JTAG/UART monitor module 450. The JTAG/UART monitor module 450 interprets JTAG/UART control code and/or data and/or configures the embedded processor 444 and/or a frame capture module 452 for the appropriate format. The frame capture module 452, in turn, stores/retrieves data to/from memory 454 and receives results of emulation and debugging from trace module 456 (and trace buffer 470) and/or peripheral modules 460, which control the frame capture module 452 packages data that is output by the SOC 420 into frames. In some implementations, the SOC components 474 may communicate directly with the frame capture module 452. JTAG and/or UART control modules 464 and/or DDO control module 466 selectively send control code and/or data to UART interface module 402, JTAG interface module 404 and/or DDO module 480 as needed. The JTAG and UART control modules 464 may be considered part of the peripheral modules 460. The memory 454 also stores data for the peripheral modules 460 and the embedded processor 444. The embedded processor 444 also communicates with the JTAG and/or UART controllers 464 and the DDO module 466.

The high speed deserializer 434 deserializes data received from the high speed serializer 478 and outputs the serialized data to the frame sync module 438. The frame sync module 438 selectively outputs data to an external diagnostic data output (DDO) module 480 that includes a digital to analog converter (DAC) 482. The external DDO module 480 outputs state signals from DDO control module 466 to state indicator(s) 484 such as light emitting diodes (LEDs), other types of displays and/or audible outputs. The DAC 482 outputs analog output signals from DDO control module 466 to an oscilloscope 490. The DDO module 480 outputs digital signals to a logic analyzer 492.

In use, the external debugging and emulation program in the host device 120 uses the UART and/or JTAG interface modules 402 and 404 to access and control the embedded ICE 446. The embedded ICE 446 can access, control, upload and download data to/from memory 454 and/or peripheral modules 460, which control other SOC components 474. The output of the debugging and emulation process is forwarded to the trace module 456 and/or the trace buffer 470.

The frame capture module 452 packages data from the trace logic 456 and control code, data, state data, and/or error messages from the JTAG and/or UART control module 464 and/or the DDO control module 466 into frames. In some implementations, the frames include control frames and trace data frames. The DDO module 480 and interfaces 424 and 426 receive control information after alignment by frame sync module 438.

The parallel frame data is serialized by the high speed serializer 478 and output serially to the high speed deserializer 434. As can be appreciated, the number of pins can be significantly reduced without adversely impacting bandwidth. The deserializer 434 returns the serial data back to a parallel format. The frame sync circuit 438 receives the parallel data from the high speed deserializer 434 and synchronizes frames. The frames are output to the trace port and status analyzer 408. Depending upon the type of control interface that is used, the data may also be output by the frame sync module 438 to the UART interface module 402, the JTAG interface module 404 and/or the DDO module 480.

The JTAG/UART monitor module 450 receives configuration information from the external debugging and emulation program through the UART and/or JTAG interface logic. The JTAG monitor portion of JTAG/UART monitor 450 can be performed by the embedded processor 444 as described above. The information is used by the JTAG/UART monitor module 450 to configure the frame capture module 452 and/or the embedded ICE 446. The timing and manner in which framing is performed may be affected by the nature of the testing to be performed, the nature of the testing output, the timing of the testing output, synchronization, etc. The JTAG and/or UART control modules 464 generate control information for the UART and JTAG interface modules 402 and 404.

Figure 5:
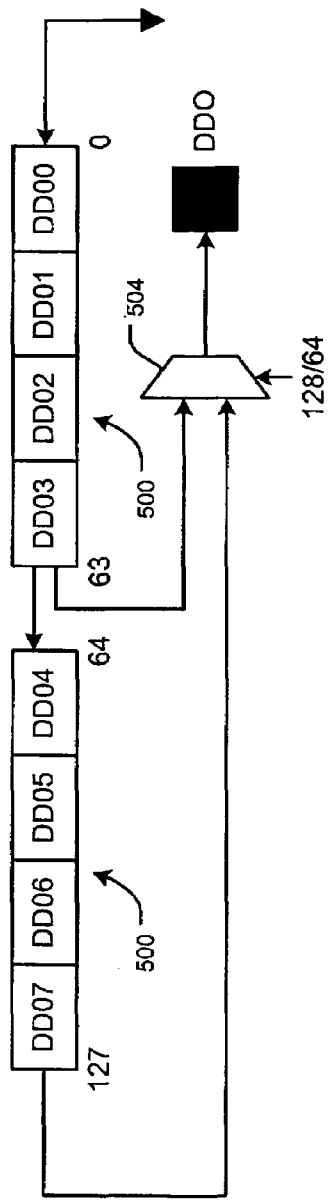
FIG. 5 is a functional block diagram of a diagnostic data output (DDO) module of the system in FIG. 4.
Figure 5:
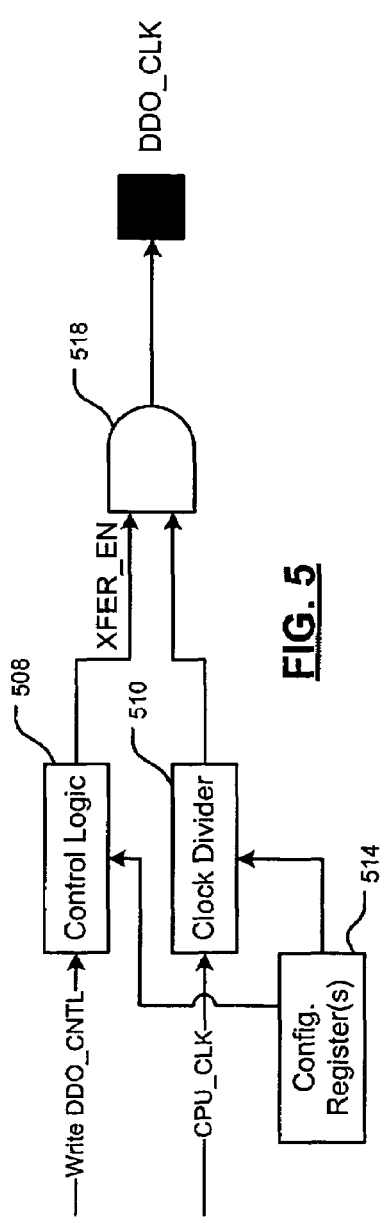
Figure 6:
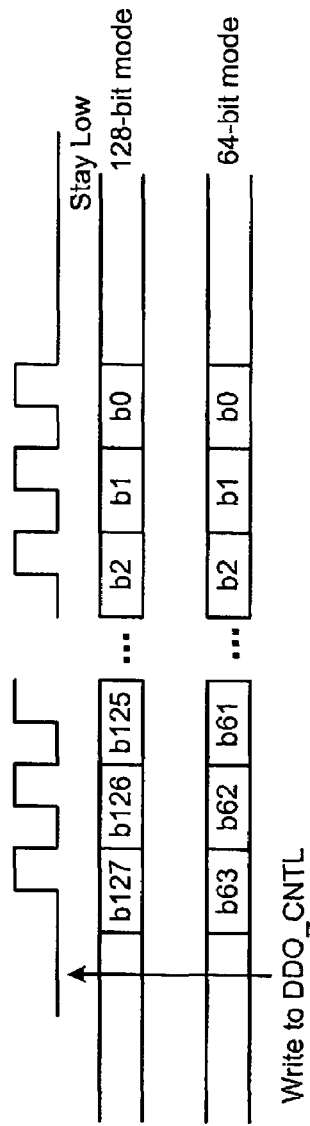
FIG. 6 is a signal diagram illustrating operation of the DDO module.

Referring now to FIGS. 5 and 6, additional details relating to the DDO control module 466 are shown. The DDO control module 466 allows firmware to send data such as control code, state messages and/or error messages. Some state messages and/or error messages are best viewed in analog format. Therefore, these messages are selectively converted by the DAC 482 to analog signals for viewing on the oscilloscope 490. In some implementations, the DDO control module 466 employs a 2 pin digital output.

In some implementations, the DDO control module 466 includes data registers 500 and a mode-selecting multiplexer 504. Control logic 508 receives a write DDO_CNTRL signal and a clock divider 510 receives a CPU_CLK signal. The control logic 508 and the clock divider 510 may also communicate with configuration registers 514. Outputs of the control logic 508 and clock divider 510 are output to an AND gate, which outputs DDO_CLK.

The DDO control module 466 allows firmware to send up to 8 words of digital information on the DDO and DDO_CLK pins. The DDO pin carries the serial data shifted out from DDO registers [7:0]. The DDO signal is synchronous to DDO_CLK, which is toggled only while shifting out DDO data. While 8 words are shown, skilled artisans will appreciate that additional and/or fewer words can be accommodated.

DDO_CLK may be generated by dividing the CPU_CLK signal by an integer such as 2, 4, 8, etc. Clock divider and clock source selection can also be made programmable using the configuration registers 514. For example, to send out 4 words of data, the DDO[63:48] through DDO[15:0] registers are used. To send out 8 words of data, the DDO[127:112] through DDO[15:0] are used. After the CPU writes the control logic bits into W_64_DDO or W_128_DDO, the register starts the DDO clock and DDO shifts out. The MSB is sent first.

In some implementations, either JTAG or UART control is active during emulation and debugging. DDO can be either active or inactive during emulation and debugging. In other implementations, JTAG, UART and DDO are active during emulation and debugging.

For multiple processor applications, the serial implementation of the present invention provides additional advantages. The additional processor(s) may be traced and cross-triggered at the same time. With parallel implementations, either twice as many pins would be needed or only a single processor can be traced at a time.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A system for testing a target integrated circuit, comprising:
    a host device that executes a debugging and testing analysis program, that transmits test instructions and data to the target integrated circuit and that analyzes received data from the target integrated circuit;
    a first interface module that communicates with said host device and that formats said test instructions and data using a first format;
    a first serializer that serializes said formatted test instructions and data and that is separate from said first interface module;
    a first deserializer on said target integrated circuit that communicates with said first serializer and that deserializes said test instructions and data; and
    a control module on the target integrated circuit that communicates with said first deserializer, that interprets said test instructions and data using said first format, that includes a testing module that receives said interpreted test instructions and data from said control module and that performs testing and debugging of said target integrated circuit.

2. The system of claim 1 wherein said first format is substantially compliant with a Joint Task Action Group (JTAG) format.

3. The system of claim 1 wherein said first format is a universal asynchronous receiver transmitter (UART) format.

4. The system of claim 1 further comprising a second interface module that communicates with said host device and that formats said test instructions and data using a second format, wherein said control module interprets said test instructions and data using said second format.

5. The system of claim 4 further comprising:
    a frame capture module on said target integrated circuit that receives test results;
    a format control module that communicates with said frame capture module and that selectively generates one of first and second format control data for a respective one of said first and second interface logic modules, wherein said frame capture module packages at least one of said test results and said one of said first and second format control data into frames; and
    a second serializer that serializes said frames from said frame capture module.

6. The system of claim 5 wherein said second serializer operates a rate that is higher than a rate of said first serializer.

7. The system of claim 1 wherein said testing module includes an embedded in-circuit emulator (ICE) that emulates functionality of at least one processor on said target integrated circuit.

8. The system of claim 1 further comprising:
    a frame capture module on said target integrated circuit that receives test results;
    a first control module that communicates with said frame capture module and that generates first format control data for said first interface module, wherein said frame capture module packages at least one of said test results and said first format control data into frames; and
    a second serializer that serializes said frames from said frame capture module.

9. The system of claim 8 further comprising:
    a second deserializer that communicates with said second serializer and that deserializes said frames; and
    a frame sync module that receives said deserialized frames and that synchronizes said frames.

10. The system of claim 9 further comprising an analyzer that receives said frames from said frame sync module.

11. A system for testing a target integrated circuit, comprising:
    a host device that executes a debugging and testing analysis program, that transmits test instructions and data to the target integrated circuit and that analyzes received data from the target integrated circuit;
    a first interface module that communicates with said host device and that formats said test instructions and data using a first format;
    a first serializer that serializes said formatted test instructions and data;
    a first deserializer on said target integrated circuit that communicates with said first serializer and that deserializes said test instructions and data; and
    a control module on the target integrated circuit that communicates with said first deserializer, that interprets said test instructions and data using said first format, that includes a testing module that receives said interpreted test instructions and data from said control module and that performs testing and debugging of said target integrated circuit;
    a frame capture module on said target integrated circuit that receives test results;
    a first control module that communicates with said frame capture module and that generates first format control data for said first interface module, wherein said frame capture module packages at least one of said test results and said first format control data into frames; and
    a second serializer that serializes said frames from said frame capture module,
    wherein said second serializer operates a rate that is higher than a rate of said first serializer.

12. A system for testing a target integrated circuit, comprising:
   a host device that executes a debugging and testing analysis program, that transmits test instructions and data to the target integrated circuit and that analyzes received data from the target integrated circuit;
   a first interface module that communicates with said host device and that formats said test instructions and data using a first format;
   a first serializer that serializes said formatted test instructions and data;
   a first deserializer on said target integrated circuit that communicates with said first serializer and that deserializes said test instructions and data; and
   a control module on the target integrated circuit that communicates with said first deserializer, that interprets said test instructions and data using said first format, that includes a testing module that receives said interpreted test instructions and data from said control module and that performs testing and debugging of said target integrated circuit;
   a frame capture module on said target integrated circuit that receives test results;
   a first control module that communicates with said frame capture module and that generates first format control data for said first interface module, wherein said frame capture module packages at least one of said test results and said first format control data into frames;
   a second serializer that serializes said frames from said frame capture module;
   a second deserializer that communicates with said second serializer and that deserializes said frames; and
   a frame sync module that receives said deserialized frames and that synchronizes said frames,
   wherein said frame sync module forwards control frames to said first interface module.

13. A system for testing a target integrated circuit, comprising:
   a host device that executes a debugging and testing analysis program, that transmits test instructions and data to the target integrated circuit and that analyzes received data from the target integrated circuit;
   a first interface module that communicates with said host device and that formats said test instructions and data using a first format;
   a first serializer that serializes said formatted test instructions and data;
   a first deserializer on said target integrated circuit that communicates with said first serializer and that deserializes said test instructions and data; and
   a control module on the target integrated circuit that communicates with said first deserializer, that interprets said test instructions and data using said first format, that includes a testing module that receives said interpreted test instructions and data from said control module and that performs testing and debugging of said target integrated circuit;
   a frame capture module on said target integrated circuit that receives test results;
   a first control module that communicates with said frame capture module and that generates first format control data for said first interface module, wherein said frame capture module packages at least one of said test results and said first format control data into frames;
   a second serializer that serializes said frames from said frame capture module;
   a second deserializer that communicates with said second serializer and that deserializes said frames;
   a frame sync module that receives said deserialized frames and that synchronizes said frames; and
   a diagnostic module that receives at least one of digital control, state and/or error data from said frame sync module.

14. The system of claim 13 wherein said diagnostic module includes a digital to analog converter (DAC) that converts said at least one of said digital control, state and/or error data to at least one of analog control, state and/or error data.

15. The system of claim 14 further comprising an oscilloscope that communicates with said DAC and that displays said at least one of said analog control, state and/or error data.

16. The system of claim 15 further comprising:
   a logic analyzer that communicates with said diagnostic module; and
   an indicator that communicates with said diagnostic module and that displays state data.

17. A method for testing a target integrated circuit, comprising:
   executing a debugging and testing analysis program;
   transmitting test instructions and data to the target integrated circuit and analyzing received data from the target integrated circuit;
   formatting said test instructions and data using a first format at a test interface module;
   serializing said formatted test instructions and data at a serializer that is separate from said first interface module;
   deserializing said test instructions and data; and
   interpreting said test instructions and data using said first format; and
   performing testing and debugging of said target integrated circuit.

18. The method of claim 17 wherein said first format is substantially compliant with a Joint Task Action Group (JTAG) format.

19. The method of claim 17 wherein said first format is a universal asynchronous receiver transmitter (UART) format.

20. The method of claim 17 further comprising:
   formatting said test instructions and data using a second format; and
   interpreting said test instructions and data using said second format.

21. The method of claim 20 further comprising:
   receiving test results;
   selectively generating one of first and second format control data;
   packaging at least one of said test results and said one of said first and second format control data into frames; and
   serializing said frames.

22. The method of claim 17 further comprising emulating functionality of at least one processor on said target integrated circuit.

23. The method of claim 17 further comprising:
   receiving test results;
   generating first format control data;
   packaging at least one of said test results and said first format control data into frames; and
   serializing said frames.

24. The method of claim 23 further comprising:
   deserializing said frames; and
   receiving said deserialized frames and synchronizing said frames.

25. The method of claim 24 further comprising analyzing said frames.

26. A method for testing a target integrated circuit, comprising:
- executing a debugging and testing analysis program;
- transmitting test instructions and data to the target integrated circuit and analyzing received data from the target integrated circuit;
- formatting said test instructions and data using a first format;
- serializing said formatted test instructions and data;
- deserializing said test instructions and data;
- interpreting said test instructions and data using said first format;
- performing testing and debugging of said target integrated circuit;
- receiving test results;
- generating first format control data;
- packaging at least one of said test results and said first format control data into frames;
- serializing said frames;
- deserializing said frames;
- receiving said deserialized frames and synchronizing said frames; and
- forwarding control frames.

27. A method for testing a target integrated circuit, comprising:
- executing a debugging and testing analysis program;
- transmitting test instructions and data to the target integrated circuit and analyzing received data from the target integrated circuit;
- formatting said test instructions and data using a first format;
- serializing said formatted test instructions and data;
- deserializing said test instructions and data;
- interpreting said test instructions and data using said first format;
- performing testing and debugging of said target integrated circuit;
- receiving test results;
- generating first format control data;
- packaging at least one of said test results and said first format control data into frames;
- serializing said frames;
- deserializing said frames;
- receiving said deserialized frames and synchronizing said frames;
- receiving at least one of digital control, state and/or error data; and
- converting said at least one of said digital control, state and/or error data to at least one of analog control, state and/or error data.

28. The method of claim 27 further comprising displaying said at least one of said analog control, state and/or error data.

29. A system for testing a target integrated circuit, comprising:
- host means for executing a debugging and testing analysis program, for transmitting test instructions and data to the target integrated circuit and for analyzing received data from the target integrated circuit;
- first interface means for communicating with said host means and for formatting said test instructions and data using a first format;
- first serializer means for serializing said formatted test instructions and data that is separate from said first interface means;
- first deserializer means on said target integrated circuit for communicating with said first serializer means and for deserializing said test instructions and data; and
- control means on the target integrated circuit for communicating with said first deserializer means and for interpreting said test instructions and data using said first format and that includes testing means for receiving said interpreted test instructions and data from said control means and for performing testing and debugging of said target integrated circuit.

30. The system of claim 29 wherein said first format is substantially compliant with a Joint Task Action Group (JTAG) format.

31. The system of claim 29 wherein said first format is a universal asynchronous receiver transmitter (UART) format.

32. The system of claim 29 further comprising second interface means for communicating with said host means and for formatting said test instructions and data using a second format, wherein said control means interprets said test instructions and data using said second format.

33. The system of claim 32 further comprising:
- frame capture means on said target integrated circuit for receiving test results;
- format control means for communicating with said frame capture means and for selectively generating one of first and second format control data for a respective one of said first and second interface logic means, wherein said frame capture means packages at least one of said test results and said one of said first and second format control data into frames; and
- second serializer means for serializing said frames from said frame capture means.

34. The system of claim 33 wherein said second serializer means operates at a rate that is higher than a rate of said first serializer means.

35. The system of claim 29 wherein said testing means includes an embedded emulating means for emulating functionality of at least one processor on said target integrated circuit.

36. The system of claim 29 further comprising:
- frame capture means on said target integrated circuit for receiving test results;
- first control means for communicating with said frame capture means and for generating first format control data for said first interface means, wherein said frame capture means packages at least one of said test results and said first format control data into frames; and
- second serializing means for serializing said frames from said frame capture means.

37. The system of claim 36 further comprising:
- second deserializer means for communicating with said second serializer means and for deserializing said frames; and
- frame sync means for receiving said deserialized frames and for synchronizing said frames.

38. The system of claim 37 further comprising analyzing means for receiving said frames from said frame sync means.

39. A system for testing a target integrated circuit, comprising:
- host means for executing a debugging and testing analysis program, for transmitting test instructions and data to the target integrated circuit and for analyzing received data from the target integrated circuit;
- first interface means for communicating with said host means and for formatting said test instructions and data using a first format;
- first serializer means for serializing said formatted test instructions and data;

first deserializer means on said target integrated circuit for communicating with said first serializer means and for deserializing said test instructions and data; and control means on the target integrated circuit for communicating with said first deserializer means and for interpreting said test instructions and data using said first format and that includes testing means for receiving said interpreted test instructions and data from said control means and for performing testing and debugging of said target integrated circuit;

frame capture means on said target integrated circuit for receiving test results;

first control means for communicating with said frame capture means and for generating first format control data for said first interface means, wherein said frame capture means packages at least one of said test results and said first format control data into frames; and second serializing means for serializing said frames from said frame capture means, wherein said second serializing means operates at a rate that is higher than a rate of said first serializer means.

40. A system for testing a target integrated circuit, comprising:

host means for executing a debugging and testing analysis program, for transmitting test instructions and data to the target integrated circuit and for analyzing received data from the target integrated circuit;

first interface means for communicating with said host means and for formatting said test instructions and data using a first format;

first serializer means for serializing said formatted test instructions and data;

first deserializer means on said target integrated circuit for communicating with said first serializer means and for deserializing said test instructions and data; and control means on the target integrated circuit for communicating with said first deserializer means and for interpreting said test instructions and data using said first format and that includes testing means for receiving said interpreted test instructions and data from said control means and for performing testing and debugging of said target integrated circuit;

frame capture means on said target integrated circuit for receiving test results;

first control means for communicating with said frame capture means and for generating first format control data for said first interface means, wherein said frame capture means packages at least one of said test results and said first format control data into frames;

second serializing means for serializing said frames from said frame capture means;

second deserializer means for communicating with said second serializer means and for deserializing said frames; and frame sync means for receiving said deserialized frames and for synchronizing said frames, wherein said frame sync means forwards control frames to said first interface means.

41. A system for testing a target integrated circuit, comprising:

host means for executing a debugging and testing analysis program, for transmitting test instructions and data to the target integrated circuit and for analyzing received data from the target integrated circuit;

first interface means for communicating with said host means and for formatting said test instructions and data using a first format;

first serializer means for serializing said formatted test instructions and data;

first deserializer means on said target integrated circuit for communicating with said first serializer means and for deserializing said test instructions and data; and control means on the target integrated circuit for communicating with said first deserializer means and for interpreting said test instructions and data using said first format and that includes testing means for receiving said interpreted test instructions and data from said control means and for performing testing and debugging of said target integrated circuit;

frame capture means on said target integrated circuit for receiving test results;

first control means for communicating with said frame capture means and for generating first format control data for said first interface means, wherein said frame capture means packages at least one of said test results and said first format control data into frames;

second serializing means for serializing said frames from said frame capture means;

second deserializer means for communicating with said second serializer means and for deserializing said frames; and frame sync means for receiving said deserialized frames and for synchronizing said frames; and diagnostic means for receiving at least one of digital control, state and/or error data from said frame sync means.

42. The system of claim 41 wherein said diagnostic means includes analog converting means for converting said at least one of said digital control, state and/or error data to at least one of analog control, state and/or error data.

43. The system of claim 42 further comprising display means for communicating with said DAC and for displaying said at least one of said analog control, state and/or error data.

44. The system of claim 43 further comprising:

logic analyzing means for communicating with said diagnostic means; and indicating means for communicating with said diagnostic means and for displaying state data.

* * * * *

UNITED STATES PATENT AND TRADEMARK OFFICE
CERTIFICATE OF CORRECTION

PATENT NO. : 7,444,571 B1  
APPLICATION NO. : 11/065584  
DATED : October 28, 2008  
INVENTOR(S) : Saeed Azimi et al.

It is certified that error appears in the above-identified patent and that said Letters Patent is hereby corrected as shown below:

| | |
|---|---|
| Title Page 2, Column 1, | Under US Patent Documents Pat. No. 6,457,124, delete "7/2002" and insert -- 9/2002 -- and delete "Yamashita" and insert -- Edwards et al. -- |
| Column 7, Line 58 | Insert -- a -- after "is" |
| Column 13, Line 50 | Insert -- serialized formatted -- after "said" |
| Column 14, Line 49 | Insert -- serialized formatted -- after "said" |
| Column 15, Line 14 | Insert -- serialized formatted -- after "said" |
| Column 15, Line 51 | Insert -- serialized formatted -- after "said" |
| Column 16, Line 31 | Insert -- serialized formatted -- after "said" |
| Column 17, Line 10 | Insert -- serialized formatted -- after "said" |
| Column 17, Line 33 | Insert -- serialized formatted -- after "said" |
| Column 17, Line 67 | Insert -- serialized formatted -- after "said" |
| Column 19, Line 3 | Insert -- serialized formatted -- after "said" |
| Column 19, Line 35 | Insert -- serialized formatted -- after "said" |
| Column 20, Line 18 | Insert -- serialized formatted -- after "said" |

Signed and Sealed this

Seventeenth Day of March, 2009

JOHN DOLL  
*Acting Director of the United States Patent and Trademark Office*